United States Patent
Park et al.

(10) Patent No.: US 12,314,859 B2
(45) Date of Patent: May 27, 2025

(54) ELECTRONIC APPARATUS FOR DECOMPRESSING A COMPRESSED ARTIFICIAL INTELLIGENCE MODEL AND CONTROL METHOD THEREFOR

(71) Applicant: SAMSUNG ELECTRONICS CO., LTD., Suwon-si (KR)

(72) Inventors: Baeseong Park, Suwon-si (KR); Sejung Kwon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 859 days.

(21) Appl. No.: 17/519,285

(22) Filed: Nov. 4, 2021

(65) Prior Publication Data
US 2022/0114454 A1 Apr. 14, 2022

Related U.S. Application Data

(63) Continuation of application No. PCT/KR2021/012371, filed on Sep. 10, 2021.

(30) Foreign Application Priority Data

Oct. 8, 2020 (KR) .................. 10-2020-0129873

(51) Int. Cl.
*G06N 3/082* (2023.01)
*G06N 3/063* (2023.01)
(Continued)

(52) U.S. Cl.
CPC ............. *G06N 3/082* (2013.01); *G06N 3/063* (2013.01); *G11C 19/00* (2013.01); *H03M 7/70* (2013.01)

(58) Field of Classification Search
CPC ........ G06N 3/082; G06N 3/063; G11C 19/00; H03M 7/70
(Continued)

(56) References Cited

U.S. PATENT DOCUMENTS 9,817,068 B1 11/2017 Chickermane et al.
10,535,161 B2 1/2020 Budagavi et al.
(Continued)

FOREIGN PATENT DOCUMENTS

CN 107092961 B 8/2018
CN 109325590 B 11/2020
(Continued)

OTHER PUBLICATIONS

Li et al., "A Network-Centric Hardware / Algorithm Co-Design to Accelerate Distributed Training of Deep Neural Networks", 2018 51st Annual IEEE/ACM International Symposium on Microarchitecture, 2018 (Year: 2018).*
(Continued)

*Primary Examiner* — Tsu-Chang Lee
(74) *Attorney, Agent, or Firm* — Sughrue Mion, PLLC

(57) ABSTRACT

An electronic apparatus may include a memory configured to store compressed data that is to be decompressed for a neural network calculation of an artificial intelligence model; a decoder including a shift register configured to sequentially receive the compressed data in group units and output at least two groups of the compressed data, and a plurality of logic circuits configured to decompress the at least two groups of the compressed data to obtain decompressed data; and a processor configured to obtain the decompressed data in a form capable of being calculated by a neural network.

18 Claims, 21 Drawing Sheets

(51) Int. Cl.
G11C 19/00 (2006.01)
H03M 7/30 (2006.01)

(58) Field of Classification Search
USPC .......................................................... 706/19
See application file for complete search history.

(56) References Cited

U.S. PATENT DOCUMENTS

| | | | |
|---|---|---|---|
| 10,608,664 | B2 | 3/2020 | Lee et al. |
| 10,853,974 | B2 | 12/2020 | Budagavi et al. |
| 11,057,585 | B2 | 7/2021 | Kim et al. |
| 2008/0195346 | A1 | 8/2008 | Lin et al. |
| 2011/0047426 | A1 | 2/2011 | Touba et al. |
| 2019/0081637 | A1* | 3/2019 | Pool ................... G06F 12/0866 |
| 2019/0139266 | A1 | 5/2019 | Budagavi et al. |
| 2019/0220776 | A1 | 7/2019 | Huang et al. |
| 2019/0303750 | A1 | 10/2019 | Kumar et al. |
| 2020/0151913 | A1 | 5/2020 | Budagavi et al. |
| 2020/0234131 | A1 | 7/2020 | Lee et al. |
| 2020/0336699 | A1 | 10/2020 | Kim et al. |
| 2020/0342632 | A1* | 10/2020 | Frumkin ................. G06T 9/002 |
| 2020/0382730 | A1* | 12/2020 | Kurokawa ........... H10D 86/441 |
| 2021/0065334 | A1 | 3/2021 | Kim et al. |
| 2021/0082087 | A1 | 3/2021 | Kim et al. |
| 2021/0366081 | A1 | 11/2021 | Kim et al. |

FOREIGN PATENT DOCUMENTS

| | | | |
|---|---|---|---|
| KR | 1020190053129 A | 5/2019 | |
| KR | 102017997 B1 | 9/2019 | |
| KR | 10-2019-0128980 A | 11/2019 | |

OTHER PUBLICATIONS

Se Jung Kwon et al., "Structured Compression by Weight Encryption for Unstructured Pruning and Quantization", Computer Vision Foundation, 2020, 10 pages total.

Daehyun Ahn et al., "Double Viterbi: Weight Encoding for High Compression Ratio and Fast On-Chip Reconstruction for Deep Neural Network", ICLR, 2019, 15 pages total.

Sian Jin et al., "DeepSZ: A Novel Framework to Compress Deep Neural Networks by Using Error-Bounded Lossy Compression", arXiv:1901.09124v2, Apr. 2019, 12 pages total.

International Search Report (PCT/ISA/210) and Written Opinion (PCT/ISA/237) dated Dec. 16, 2021 issued by the International Searching Authority in International Application No. PCT/KR2021/012371.

Communication issued Dec. 23, 2024 from the Korean Intellectual Property Office for Korean Patent Application No. 10-2020-0129873.

* cited by examiner

FIG. 1B $$\begin{pmatrix} 0 & 0 & 0 & 0 \\ 5 & 8 & 0 & 0 \\ 0 & 0 & 3 & 0 \\ 0 & 6 & 0 & 0 \end{pmatrix} \Rightarrow \begin{matrix} A = [5\ 8\ 3\ 6] \\ IA = [0\ 0\ 2\ 3\ 4] \\ JA = [0\ 1\ 2\ 1] \end{matrix}$$

FIG. 1C

Pruning Mask $$\begin{pmatrix} 0 & 1 & 0 & \cdots & 1 \\ 1 & 0 & 0 & \cdots & 0 \\ \vdots & & & & \vdots \\ 0 & 1 & 0 & \cdots & 0 \end{pmatrix}$$

0 : pruned

Quantized Bits x Coefficient $$\begin{pmatrix} x & 0 & x & \cdots & 1 \\ 0 & x & x & \cdots & x \\ \vdots & & & & \vdots \\ x & 1 & x & \cdots & x \end{pmatrix} \begin{pmatrix} \alpha_1 \\ \alpha_2 \\ \vdots \\ \alpha_n \end{pmatrix} = \begin{pmatrix} 0 & -\alpha_1 & 0 & \cdots & \alpha_1 \\ -\alpha_2 & 0 & 0 & \cdots & 0 \\ \vdots & & & & \vdots \\ 0 & \alpha_n & 0 & \cdots & 0 \end{pmatrix}$$

X : Don't Care Bits
0,1 : Care Bits

FIG. 3A $$\begin{bmatrix} W_{11} & W_{12} & W_{13} & \cdots & W_{1n} \\ W_{21} & & & & W_{2n} \\ W_{31} & & & & W_{3n} \\ & & & \ddots & \\ \vdots & & & & \vdots \\ W_{m1} & W_{m2} & W_{m3} & \cdots & W_{mn} \end{bmatrix}$$

FIG. 4A $$A \begin{bmatrix} 1 & 0 & 1 & 0 & 0 & 1 & 0 & 1 \\ 1 & 0 & 0 & 1 & 0 & 0 & 0 & 1 \\ 1 & 0 & 0 & 0 & 1 & 1 & 0 & 0 \\ 1 & 1 & 0 & 0 & 0 & 1 & 0 & 0 \\ 1 & 1 & 1 & 0 & 0 & 0 & 1 & 1 \\ 0 & 1 & 0 & 1 & 0 & 1 & 1 & 1 \\ 0 & 1 & 0 & 0 & 1 & 0 & 0 & 0 \\ 0 & 0 & 1 & 1 & 0 & 0 & 0 & 1 \\ 0 & 0 & 0 & 1 & 1 & 1 & 1 & 1 \\ 0 & 0 & 1 & 0 & 0 & 1 & 0 & 1 \end{bmatrix} \begin{bmatrix} X_0 \\ X_1 \\ X_2 \\ X_3 \\ X_4 \\ X_5 \\ X_6 \\ X_7 \end{bmatrix} = \begin{bmatrix} - \\ 0 \\ 1 \\ - \\ 1 \\ 1 \\ - \\ 0 \\ 0 \\ 1 \end{bmatrix}$$

FIG. 4B $$\begin{matrix} & A & & X & & B \\ \begin{bmatrix} 1 & 0 & 1 & 0 & 0 & 1 & 0 & 1 \\ 1 & 0 & 0 & 1 & 0 & 0 & 0 & 1 \\ 1 & 0 & 0 & 0 & 1 & 1 & 0 & 0 \\ 1 & 1 & 0 & 0 & 0 & 1 & 0 & 0 \\ 1 & 1 & 1 & 0 & 0 & 0 & 1 & 1 \\ 0 & 1 & 0 & 1 & 0 & 1 & 1 & 1 \\ 0 & 1 & 0 & 0 & 1 & 0 & 0 & 0 \\ 0 & 0 & 1 & 1 & 0 & 0 & 0 & 1 \\ 0 & 0 & 0 & 1 & 1 & 1 & 1 & 1 \\ 0 & 0 & 1 & 0 & 0 & 1 & 0 & 1 \end{bmatrix} & & \begin{bmatrix} X4 \\ X5 \\ X6 \\ X7 \\ X8 \\ X9 \\ X10 \\ X11 \end{bmatrix} & = & \begin{bmatrix} 1 \\ 0 \\ 1 \\ - \\ 1 \\ - \\ - \\ 1 \\ 0 \\ 1 \end{bmatrix} \end{matrix}$$

FIG. 4C

```
0:   procedure Encoding( quantized_bits )
1:     for t ← 1 to L do
2:       for i ← 1 to 2^N - 1 do
3:         dp_{t,i} ← INF
4:         for j ← 0 to 2^N - 1 do
5:           if dp_{t,i} > Number_patchs( j, i, quantized_bits_t ) + dp_{t-1,j} then
6:             dp_{t,i} ← Number_patchs( j, i, quantized_bits_t ) + dp_{t-1,j}
7:             dp_index_{t, i} ← j
8:
9:     encoding_data_L ← INF
10:    for i ← 1 to 2^N - 1 do
11:      encoding_data_L ← Min(encoding_data_L, dp_index_{L, i} )
12:
13:    for t ← 1 to L do
14:      pre_encoding_bits ← encoding_bits_{t + 1}
15:      encoding_data_t ← dp_index_{t, pre_encoding_bits}
16:
17:    for t ← 1 to L do
18:      decoding_data ← Sequence_XOR_Decoer(encoding_data_{t-1}, encoding_data_t)
19:      patch_data_t ← Generate_patch_data( quantized_bits_t, decoding_data )
20:
21:  return encoding_data, patch_data
```

FIG. 8B

```
Quantized Bits    : x 0 x 0 1 x x 1 x x 0 x x ... x
                                1             0
Decompressed Bits : x 0 x 0 ✖ x x 1 x x ✖ x x ... x
                          Patch!        Patch!
```

ELECTRONIC APPARATUS FOR DECOMPRESSING A COMPRESSED ARTIFICIAL INTELLIGENCE MODEL AND CONTROL METHOD THEREFOR

CROSS-REFERENCE TO RELATED APPLICATION(S)

This is a bypass continuation application of International Patent Application No. PCT/KR2021/012371, filed on Sep. 10, 2021, which claims priority to Korean Patent Application No. 10-2020-0129873, filed on Oct. 8, 2020, in the Korean Intellectual Property Office, the disclosures of which are incorporated hereinby reference in their entireties.

BACKGROUND

1. Field

The disclosure relates to an artificial intelligence (AI) system that uses machine learning algorithms such as deep learning to simulate functions such as cognition and determination of human brains, and an electronic apparatus for decompressing a compressed artificial intelligence model among its applications, and a method for controlling thereof.

2. Description of the Related Art

Recently, various methods have been developed to increase a compression ratio of deep learning models while minimizing a performance degradation of the deep learning models. As compression proceeds more efficiently without the performance degradation, smaller hardware may be used and the cost required to manufacture devices running the deep learning models may be reduced. In addition, since a speed of deep learning performances has also been improved, models with a very large capacity or a slow response speed may be used in a mobile device.

The most representative of various methods to solve this problem is pruning. Pruning is a method of adjusting a plurality of weights of a deep learning model by making a weight less than a certain value zero (0) and re-training the deep learning model using the remaining weights to minimize the data size of the deep learning model while maintaining its prediction accuracy. The left side of FIG. 1A is a distribution of weight values immediately after training, the upper right side of FIG. 1A is a weight distribution after pruning, and the lower right side of FIG. 1A is a weight distribution after retraining the remaining weights. By repeating pruning and retraining, weight values are distributed in a manner that does not degrade the prediction accuracy of the deep learning model.

If pruning and retraining are repeated, a significant number of weights become zero, and the remaining have non-zero values. If a significant number of zeros are effectively removed from the matrix, a matrix size is reduced to obtain a smaller weight size. For example, assuming that a weight matrix as illustrated on the left side of FIG. 1B, substitution is possible with a sparse matrix format as illustrated on the right side of FIG. 1B to remove zero. A stores only non-zero values, and IA accumulates the number of non-zero weights corresponding to each row of the matrix except for 0, which is basically the first, and lastly JA stores column index corresponding to each non-zero value of A. In other words, magnitude and location information of non-zero values are stored using A, IA, and JA. As a pruning rate increases, the matrix becomes sparser and the format above becomes smaller than the original matrix size. The sparse matrix composed of A, IA, and JA is called compressed sparse row (CSR) format.

After pruning, the remaining non-zero values go through a quantization process. After pruning, the amount of quantized information is reduced as well as the distribution rate of values, so that pruning and quantization are often used together.

However, the CSR format has a problem that the amount of index is always larger than a magnitude of a non-zero weight corresponding to A. Therefore, there is a problem in that a compression ratio of the index needs to be increased more effectively. In addition, when an original matrix is constructed using a CSR format, there is a problem that the method of reading the CSR format itself is not suitable for parallel computing.

Among methods to increase the compression ratio while minimizing the performance degradation of the deep learning model, there is a method of compressing again using an XOR gate after pruning and quantization. In the case of quantization after pruning, as illustrated in FIG. 1C, a pruning mask, quantized bits, and coefficients may be obtained. Quantized Bits may be divided into Care Bits (0 or 1) and Don't Care Bits (x). The Don't Care Bit is a bit irrelevant no matter what value is entered in the corresponding location, and the Care Bit is the remaining bits except for the Don't Care Bit. In this case, the Quantized Bits are compressed using an XOR Network. After converting the Quantized Bits into 1D vectors, they are grouped into a certain number, and an input in which a portion of the Care Bits among the grouped bits becomes the same as an output value of the XOR gates is found in the same way as in FIG. 1D.

The compression ratio is a size of an output divided by a size of an input, and in the case of FIG. 1D, the compression ratio is 8/4, In other words, a double compression ratio may be obtained. However, since there is a case where it is not possible to find an input that makes all Care Bits the same, a method of memorizing a location where the output value of the XOR Gate and the original value are different as a patch to change the value again after decompression.

Patch means that when the output value of XOR Gates is different from Quantized Bits, it means flipping ($0 \rightarrow 1$, $1 \rightarrow 0$) of the corresponding value as illustrated in FIG. 1E. As a result, the more the number of patches, the lower the compression ratio. Particularly, when the pruning rate of each group is irregular in the grouping process, a large number of errors occur and the number of patches is increased or the compression ratio is lowered to reduce the number of patches, such that there is a problem in that a decompression speed is lowered or a hardware cost is increased.

There is a compression method using Viterbi technology as a method to increase the compression ratio while minimizing the performance degradation of the deep learning model. As illustrated in FIG. 1F, a circuit including D Flip-Flop (indicated by blocks labeled as "D") and XOR Gate (indicated by a symbol of "+") may use current inputs and previous inputs to output a plurality of bits when receiving one bit every time. This method has an advantage of being a compression method suitable for hardware because an encoding time is long but a decoding time is short. However, there is a disadvantage in that it is not suitable to try a plurality of compressions since it takes too long to find a solution, and a lot of effort and time is required for a method for finding a plurality of parameter values for using Viterbi.

Accordingly, there is a need to develop a method capable of performing parallel decompression more stably while securing a higher compression ratio by further improving the existing method.

SUMMARY

Provided are an electronic apparatus that uses an artificial intelligence model with reduced data capacity and decompresses the artificial intelligence model with reduced data capacity and a control method thereof.

According to an aspect of the disclosure, an electronic apparatus may include: a memory configured to store compressed data that is to be decompressed for a neural network calculation of an artificial intelligence model; a decoder including a shift register configured to sequentially receive the compressed data in group units and output at least two groups of the compressed data, and a plurality of logic circuits configured to decompress the at least two groups of the compressed data to obtain decompressed data; and a processor configured to obtain the decompressed data in a form capable of being calculated by a neural network.

The at least two groups may include a first group and a second group, wherein the shift register may be further configured to: receive first data of the first group among the compressed data in a first cycle, shift the first data of the first group and receive second data of the second group among the compressed data in a second cycle, and output the first data and the second data.

The at least two groups may include a first group, a second group, and a third group, wherein the shift register may be further configured to: delete, in a nth cycle, first data of the first group input in a n−2th cycle; shift second data of the second group input in a n−1th cycle; receive third data of the third group among the compressed data, and output the second data and the third data. n is a natural number that is greater than 2.

The plurality of logic circuits may be further configured to decompress the at least two groups of the compressed data output from the shift register through a plurality of XOR gates related to a compression method of the compressed data, and output the decompressed data.

The memory may be further configured to further store patch information corresponding to the compressed data. The processor may be further configured to update the decompressed data by changing a binary data value of at least one of a plurality of elements included in the decompressed data based on the patch information. The patch information may include error information generated in a process of obtaining the compressed data.

Each of the at least two groups of the compressed data may be further configured to include a first flag indicating whether a patch exists. The patch information may include a second flag indicating a patch location with respect to each of the at least two groups, and whether an additional patch exists.

The memory may be further configured to store a representative value matrix corresponding to each of the at least two groups of the compressed data. The processor may be further configured to obtain data in a form capable of being calculated by the neural network based on the updated decompressed data and the representative value matrix, and perform the neural network calculation using the data in the form capable of being calculated by the neural network. The updated decompressed data and the representative value matrix are matrices acquired by quantizing an original matrix included in the artificial intelligence model.

The processor may be further configured to acquire a pruning index matrix from the original matrix through a pruning process, to be used in a process of acquiring the compressed data, and update the decompressed data in the form capable of being calculated by the neural network based on the pruning index matrix.

The processor may be further configured to include a plurality of processing elements arranged in a matrix form, and perform the neural network calculation with respect to the data in the form capable of being calculated by the neural network using the plurality of processing elements.

The electronic apparatus may be further to be implemented as a single chip.

According to an aspect of the disclosure, a method for controlling an electronic apparatus may include: sequentially receiving a compressed data, that is to be decompressed for a neural network calculation of an artificial intelligence model; outputting at least two groups of the compressed data that are shifted by a shift register; decompressing the at least two groups of the compressed data by a plurality of logic circuits to obtain decompressed data; and obtaining data in a form capable of being calculated by a neural network from the decompressed data.

The at least two groups may include a first group and a second group. The sequentially receiving may include receiving first data of the first group among the compressed data in a first cycle, shifting the first data of the first group, and receiving second data of the second group among the compressed data in a second cycle. The outputting the at least two groups of the compressed data may include outputting the first data and the second data.

The at least two groups may include a first group, a second group, and a third group. The sequentially receiving includes deleting, in a nth cycle, first data of the first group input in a n−2th cycle, shifting second data of the second group input in a n−1th cycle, and receiving third data of the third group among the compressed data. The outputting the at least two groups of the compressed data may include outputting the second data and the third data. n is a natural number greater than 2.

The decompressing the at least two groups of the compressed data may include decompressing the at least two groups of the compressed data through a plurality of XOR gates.

The obtaining the data may include, based on patch information corresponding to the compressed data, updating the decompressed data by changing a binary data value of at least one of a plurality of elements included in the decompressed data. The patch information may include error information generated in a process of obtaining the compressed data.

According to an aspect of the disclosure, an electronic apparatus may include: a memory storing one or more instructions; and a processor configured to: shift compressed data sequentially in first cycle and a second cycle, to obtain a first group of shifted compressed data and a second group of shifted compressed data, respectively, decompress the first group of shifted compressed data and the second group of shifted compressed data via at least one logic gate, to obtain decompressed data; configure a neural network based on a plurality of weights contained the decompressed data; and process input data using the neural network configured based on the plurality of weights.

The processor may be further configured to: retrieve from the memory, patch information that includes error information generated in a compression processing of obtaining the compressed data; update the decompressed data by changing at least one binary value of the decompressed data based on the patch information; and configure the neural network based on the updated decompressed data.

The processor may be further configured to: obtain a first flag indicating whether a patch exists; obtain a second flag indicating a patch location of the patch with respect to the first group of shifted compressed data and the second group of shifted compressed data; obtain at least one representative value matrix corresponding to the first group of shifted compressed data and the second group of shifted compressed data; and update the decompressed data by changing at least one binary value of the decompressed data, based on the first flag, the second flag, and the at least one representative value matrix.

According to various embodiments of the disclosure as described above, the electronic apparatus may decompress the data by using shared data a plurality of times in the compression process using the shift register, and accordingly, and reduce a size of the patch information by reducing errors while securing a high compression ratio.

In addition, parallel processing of data may be possible, real-time decompression through hardware is possible and may be applied to all accelerators.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 3A to 3C are views illustrating a compression method according to an embodiment in stages;

FIGS. 4A to 4C are views illustrating a method of obtaining compressed data according to an embodiment;

FIGS. 8A and 8B are views illustrating a method of implementing an electronic apparatus according to an embodiment.

DETAILED DESCRIPTION

Hereinafter, the present disclosure will be described in detail with reference to the accompanying drawings.

Terms used in the present disclosure are selected as general terminologies currently widely used in consideration of the configuration and functions of the present disclosure, but can be different depending on intention of those skilled in the art, a precedent, appearance of new technologies, and the like. Further, in specific cases, terms may be arbitrarily selected. In this case, the meaning of the terms will be described in the description of the corresponding embodiments. Accordingly, the terms used in the description should not necessarily be construed as simple names of the terms, but be defined based on meanings of the terms and overall contents of the present disclosure.

In the disclosure, the terms "include" and "comprise" designate the presence of features, numbers, steps, operations, components, elements, or a combination thereof that are written in the specification, but do not exclude the presence or possibility of addition of one or more other features, numbers, steps, operations, components, elements, or a combination thereof.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

The expression "1", "2", "first", or "second" as used herein may modify a variety of elements, irrespective of order and/or importance thereof, and only to distinguish one element from another. Accordingly, without limiting the corresponding elements.

Singular forms are intended to include plural forms unless the context clearly indicates otherwise. In the present application, the terms "include" and "comprise" designate the presence of features, numbers, steps, operations, components, elements, or a combination thereof that are written in the specification, but do not exclude the presence or possibility of addition of one or more other features, numbers, steps, operations, components, elements, or a combination thereof.

Also, the term "user" may refer to a person who uses an electronic apparatus or an apparatus (e.g., an artificial intelligence (AI) electronic apparatus) that uses the electronic apparatus.

Hereinafter, embodiments will be described in greater detail with reference to the accompanying drawings.

Figure 2A:
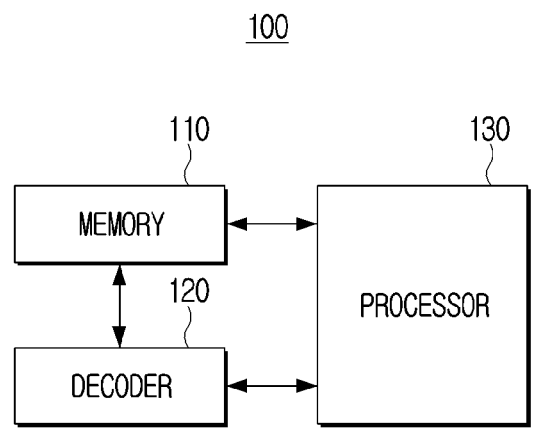
FIG. 2A is a block diagram illustrating a configuration of an electronic apparatus according to an embodiment.

FIG. 2A is a block diagram illustrating an electronic apparatus 100 according to an embodiment. As illustrated in FIG. 2A, the electronic apparatus 100 includes a memory 110, a decoder 120, and a processor 130 as illustrated in FIG. 2A. While the decoder 120 and the processor 130 are illustrated as two separate elements, the decoder 120 may be implemented as a part of the processor 130.

The electronic apparatus 100 may be a device that performs a neural network calculation based on an artificial intelligence model. For example, the electronic apparatus 100 stores an artificial intelligence model using a neural network, and may feed input data to the neural network to obtain a prediction result, as output of the neutral network. The electronic apparatus 100 may be implemented with a desktop personal computer (PC), a laptop computer, a television (TV), etc. However, the examples of the electronic apparatus 100 are not limited thereto, and the electronic apparatus 100 may be any device as long as it can perform a neural network calculation based on the artificial intelligence model.

Particularly, the electronic apparatus 100 is a device with limited resources, such as a smartphone, a tablet PC, a wearable device, etc. The electronic apparatus 100 stores compressed data of an artificial intelligence model, converts the compressed data into data in a form that can be calculated by the neural network, and performs a neural network calculation based on the data in the converted form. The data in the converted form may include a plurality of parameters within a neutral network, such as weights (and biases) that are assigned to a plurality of nodes (or neurons) of the neural network, respectively. When an input value enters a node of the neural network, the neural network multiplies the input value by a weight that is assigned to the node (and adds a bias assigned to the node, if any), to obtain a result value. As such, the neutral network may be created or configured using a plurality of weights in the data in the converted form.

The artificial intelligence model may be compressed through various methods such as pruning, quantization, or the like and may be compressed by any number of other methods.

The memory 110 may refer to hardware that stores information such as data in an electrical or magnetic form such that a decoder 120, a processor 130, or the like can be accessed. The memory 110 may be implemented as at least one of a non-volatile memory, a volatile memory, a flash memory, a hard disk drive (HDD) or a solid state drive (SDD), RAM, ROM, or the like.

At least one instruction or module required for an operation of the electronic apparatus 100 or the processor 130 may be stored in the memory 110. Here, the instruction is a unit of code for instructing the operation of the electronic apparatus 100 or the processor 130 and may be written in machine language that can be understood by a computer. A module may be a set of instructions that perform a specific task in a unit of work.

The memory 110 may store data that is information in units of bits or bytes that can represent characters, numbers, images, or the like. For example, data related to the artificial intelligence model may be stored in the memory 110.

The memory 110 may store compressed data that is to be decompressed and used in the neural network calculation of the artificial intelligence model. Here, the compressed data is data obtained after compression of the artificial intelligence model, and may include binary data. For example, compressed data may be expressed as a bit string of 0 or 1.

The memory 110 may further store patch information corresponding to the compressed data, a representative value matrix corresponding to the compressed data, and a pruning index matrix corresponding to the compressed data.

Compressed data, patch information, representative value matrix, and pruning index matrix are data obtained during a compression process of the artificial intelligence model. The decompression operation of the electronic apparatus 100 is described, and the compression method of the artificial intelligence model and a method of obtaining each data will be described below with reference to the drawings.

The decoder 120 may include a shift register for sequentially receiving compressed data in group units including a predetermined number of bits and outputting at least two groups of data, and a plurality of logic circuits for decompressing data output from the shift register and outputting the decompressed data. Here, the shift register is a set of registers installed in a linear manner in a digital circuit, and is a circuit capable of sequentially moving stored data to one side.

For example, the shift register may sequentially receive compressed data in 4-bit units and sequentially output 8-bit data. The plurality of logic circuits may decompress 8-bit data sequentially output from the shift register to obtain 10-bit data, and sequentially output 10-bit data. In other words, the decoder 120 may sequentially receive compressed data in units of 4 bits and sequentially output 10-bit decompressed data.

The processor 130 controls a general operation of the electronic apparatus 100. Specifically, the processor 130 may be connected to each component of the electronic apparatus 100 to control the overall operation of the electronic apparatus 100. For example, the processor 130 may be connected to components such as the memory 110, the decoder 120, and a communication interface to control the operation of the electronic apparatus 100.

According to an embodiment, the processor 130 may be implemented as a digital signal processor (DSP), a microprocessor, or a time controller (TCON). However, the it is not limited thereto, and may include one or more of a central processing unit (CPU), micro controller unit (MPU), micro processing unit (MPU), controller, application processor (AP), or communication processor (CP), ARM processor, or may be defined as the corresponding term. In addition, the processor 130 may be implemented as a System on Chip (SoC) or large scale integration (LSI) in which a processing algorithm is embedded, or a Field programmable gate array (FPGA).

The processor 130 may obtain data in a form capable of neural network calculation from data output from the decoder 120. For example, the processor 130 may obtain an artificial intelligence model before compression from the data output from the decoder 120. In this case, the processor 130 may obtain the artificial intelligence model before compression by further using the patch information, the representative value matrix, and the pruning index matrix, which are stored in the memory 110.

The operations of the decoder 120 and the processor 130 will be described in more detail through various modules of FIG. 2B.

The decoder 120 may include a shift register and a plurality of logic circuits. In a first cycle, the shift register may receive data of a first group among compressed data, shift data of the first group in a second cycle, receive data of a second group of compressed data, and output data of the first group and the second group. Here, the first cycle is a cycle in which compressed data is initially input to the shift register.

In the nth cycle (n is a natural number greater than 2), the shift register may delete the data of the first group input in a n−2th cycle, shift the data of the second group input in a n−1th cycle, receive data of a third group, and output data of the second group and data of the third group.

For a more specific example, assuming an 8-bit shift register, the shift register may receive 4-bit compressed data in the first cycle. In the first cycle, only 4-bit compressed data may be stored in the shift register. Then, in the second cycle, the shift register may shift the previously stored 4-bit compressed data, and additionally receive 4-bit compressed data. In the second cycle, 8-bit compressed data may be stored in the shift register. In addition, the shift register may provide 8-bit compressed data to a plurality of logic circuits in the second cycle.

In the third cycle, the shift register may delete 4-bit compressed data stored in the first cycle, shift the 4-bit compressed data received in the second cycle, and additionally receive 4-bit compressed data. In the third cycle, 8-bit compressed data may be stored in the shift register. In addition, the shift register may provide 8-bit compressed data to the plurality of logic circuits in the third cycle. An operation of the cycle after the third cycle is the same as that of the third cycle.

Figure 2B:
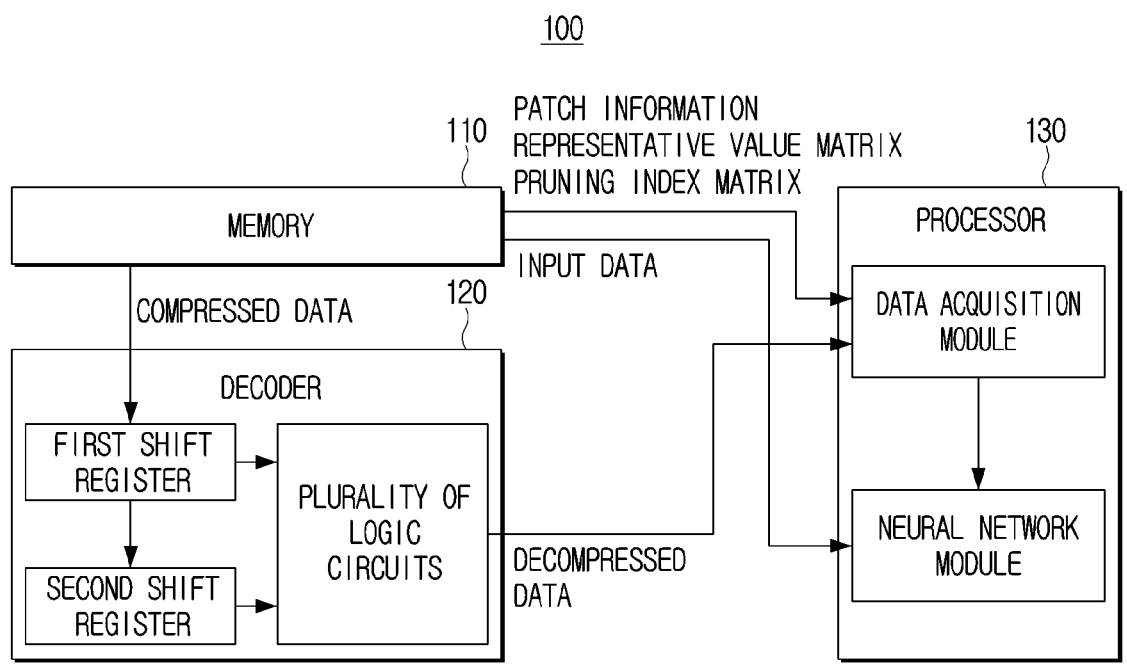
FIG. 2B is a block diagram illustrating a detailed configuration of an electronic apparatus according to an embodiment.

In order to more intuitively explain the operation of the shift register, in FIG. 2B, the shift register is illustrated as being divided into a first shift register and a second shift register.

According to the example described above, the first shift register and the second shift register are implemented to store 4 bits, respectively, and the first shift register may receive 4-bit compressed data in the first cycle. In the second cycle, the 4-bit compressed data stored in the first shift register is shifted to the second shift register, and the first shift register may additionally receive 4-bit compressed data. In addition, the first shift register and the second shift register may provide the stored compressed data to the plurality of logic circuits. In the third cycle, the 4-bit compressed data stored in the first shift register may be shifted to the second shift register. The second shift register may delete pre-stored data before the shift. Alternatively, the second shift register may overwrite pre-stored data with 4-bit compressed data shifted from the first shift register. The first shift register may further receive compressed data of 4 bits, and the first shift register and the second shift register may provide the stored compressed data to the plurality of logic circuits.

Figure 1A:
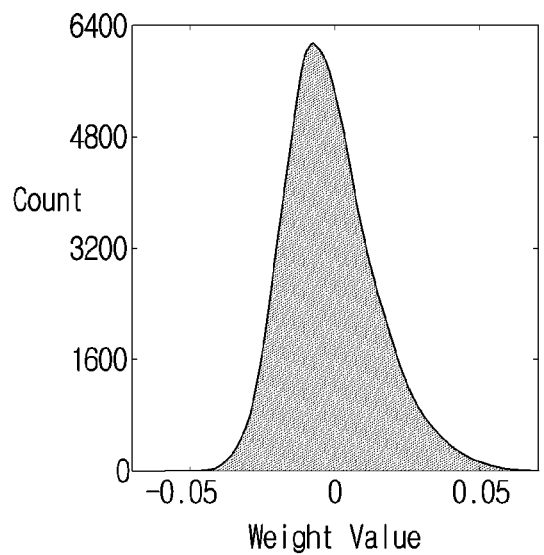
FIGS. 1A and 1F are views illustrating related art.
Figure 1A:
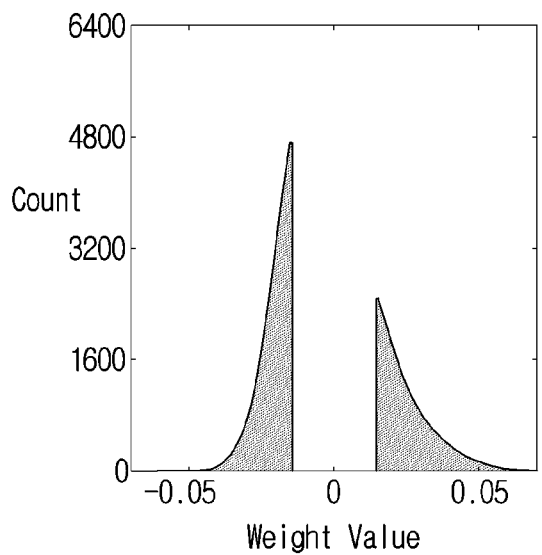
Figure 1A:
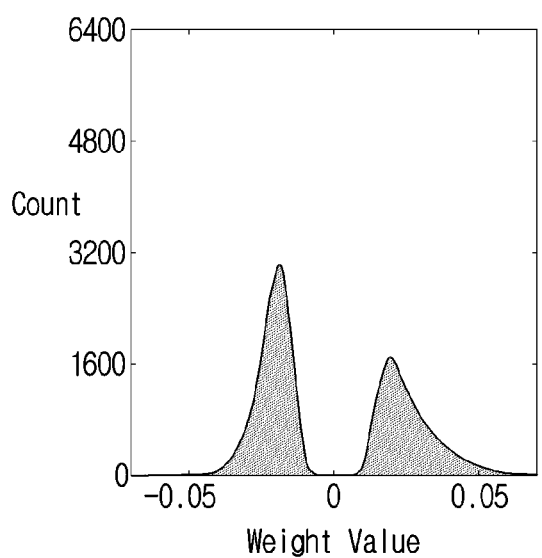

Although FIG. 1B shows that the shift register is divided into a first shift register and a second shift register, this is only an example, and the shift register may be divided into N shift registers. For example, the shift register may be divided into a first shift register, a second shift register, and a third shift register. In other words, data input in one cycle may be provided to a plurality of logic circuits during three cycles, and in this case, a compression ratio may be higher than the compression ratio in the embodiment of FIG. 1B.

The plurality of logic circuits may decompress data output from the shift register through a plurality of XOR gates related to a compression method of compressed data, and output the decompressed data. In the example described above, the plurality of logic circuits may receive 8-bit compressed data (e.g., 4-bit compressed data from the first shift register and 4-bit compressed data from the second shift register) and output 10-bit decompressed data by decompressing the 8-bit compressed data.

The plurality of logic circuits may be implemented based on an encoding matrix used in the compression process. The encoding matrix includes 0 or 1, and may be in the form of a 10×8 matrix according to the example described above. When a plurality of logic circuits are implemented with the plurality of XOR gates, input/output terminals of the plurality of XOR gates may be connected to receive and process the encoding matrix and output a processing result of the encoding matrix. In other words, when 8-bit compressed data is input through the input terminals of the plurality of XOR gates, 10-bit decompressed data may be output through the output terminals of the plurality of XOR gates. In addition, 10-bit decompressed data may be the same as a multiplication result of an encoding matrix and 8-bit compressed data.

In the compression process, unknown 8-bit compressed data may be determined through a method such as Gaussian elimination such that the multiplication operation of the encoding matrix and the unknown 8-bit compressed data becomes 10-bit data. In this case, when 10-bit data is compressed into 8-bit compressed data, an error may occur. In order to remove this error, a don't care bit depending on whether pruning is used may be used in the compression process, and a don't care bit may be generated in the decompression process. Patch information for correcting the error may be generated. A compression method in consideration of the don't care bit will be described below with reference to the drawings.

As described above, in a specific cycle, the plurality of logic circuits may receive 8-bit compressed data, but the decoder 120 may receive only 4-bit compressed data. In other words, in the above example, 10-bit data may be compressed into 4-bit compressed data. This is because, 10-bit data is compressed to 8 bits in the compression process, but 4 bits among the previously compressed 8 bits are used as it is in the process of compressing the next 10-bit data to 8 bits. According to this compression method, a shift register may be required in the decompression process.

In addition, when a part of the conventional compressed data is not shared, in order to secure the same compression ratio as in the example described above, each of 10 bits may be required to be compressed into 4 bits. According to the disclosure, 10 bits are compressed to 4 bits, but 8 bits are compressed in the compression process, such that the amount of patch information is reduced compared to the prior art.

According to the disclosure as described above, the compression ratio may increase or the amount of patch information may reduce.

Although it has been described above that the plurality of logic circuits include a plurality of XOR gates, other types of logic gates may be included. In addition, although it has been described above that 10-bit data is compressed to 4-bit compressed data, it may be compressed with any other compression ratio. In some cases, units of 10-bit may be compressed into units of 4-bit or more, and in this case, the patch information may gradually decrease or may not be generated.

The processor 130 may control the overall operation of the electronic apparatus 100 by executing a module or an instruction stored in the memory 110. Specifically, the processor 130 may read and interpret the module or instruction, and may determine a sequence for data processing, and accordingly control the operation of the other configuration by transmitting a control signal that controls the operation of the other configuration, such as the memory 110, or the like.

Positioning a plurality of modules inside the processor 130 in FIG. 2B is to indicate a state in which the plurality of modules are loaded (or executed) by the processor 130 and operated in the processor 130, and the plurality of modules may be in a state previously stored in the memory 110.

The processor 130 may obtain data in a form capable of neural network calculation from decompressed data by executing a data acquisition module configured to obtain data in a form suitable for neural network calculation.

The processor 130 may receive the patch information corresponding to the compressed data from the memory 110, and update the decompressed data by changing a binary data value of some of a plurality of elements included in the decompressed data based on the patch information. For example, the processor 130 may change 0 to 1 or 1 to 0 based on the patch information. The patch information may include error information generated in the process of obtaining compressed data.

Each of the plurality of groups of compressed data may include a first flag indicating whether a patch exists, and the patch information may include a second flag indicating a patch location for each of at least one group among the plurality of groups and a second flag indicating whether an additional patch exists. The first flag may be contained in the compressed data or provided separately from the compressed data.

The processor 130 may identify whether the patch information exists based on the first flag, and when it is identified that the patch information exists, the processor 130 may change binary data of a part of the compressed data based on the patch location indicated by the patch information. The processor 130 may identify an existence of the additional patch information based on the second flag, and when it is identified that the additional patch information exists, the binary data of the part of the compressed data may be changed based on the patch location indicated by the additional patch information.

The processor 130 may receive a representative value matrix corresponding to the compressed data from the memory 110, and may obtain data in a form suitable for a neural network calculation based on the updated data and the representative value matrix. The updated data and the representative value matrix may be matrices obtained by quantizing the original matrix included in the artificial intelligence model.

In addition, the processor 130 may receive a pruning index matrix corresponding to the compressed data from the memory 110, and update the data in a form suitable for a neural network calculation based on the pruning index matrix to perform a neural network calculation. The pruning index matrix may be a matrix obtained in the pruning process of the original matrix, and may be used in the process of obtaining compressed data.

However, it is not limited thereto, and the operation using the patch information and the operation using the pruning index matrix may be performed in parallel. Particularly, the operation using the pruning index matrix may be performed at any time if it is before the neural network calculation.

The processor 130 may perform a neural network calculation on the input data received from the memory 110 by using finally obtained data in a form suitable for neural network calculation by executing the neural network calculation module.

The processor 130 may include a plurality of processing elements arranged in a matrix form, and may perform a neural network calculation on the finally obtained data by using the plurality of processing elements.

The electronic apparatus 100 described above may be implemented as a single chip. However, it is not limited thereto, and the memory 110 and the processor 130 may be implemented as separate hardware components, and the processor 130 may be implemented in a form including the decoder 120.

It has been described that the compressed data has a binary value, but the it is not limited thereto. For example, the compressed data may be all types of pruned data (ex: int8, float32, binary, etc.), and even in this case, the disclosure may be applied.

As described above, since the decoder 120 includes the shift register and a part of compressed data is shared according to the operation of the shift register, the size of patch information may be reduced by reducing errors while increasing the compression ratio.

Hereinafter, a method of obtaining compressed data will be described for convenience of description.

Figure 3B:
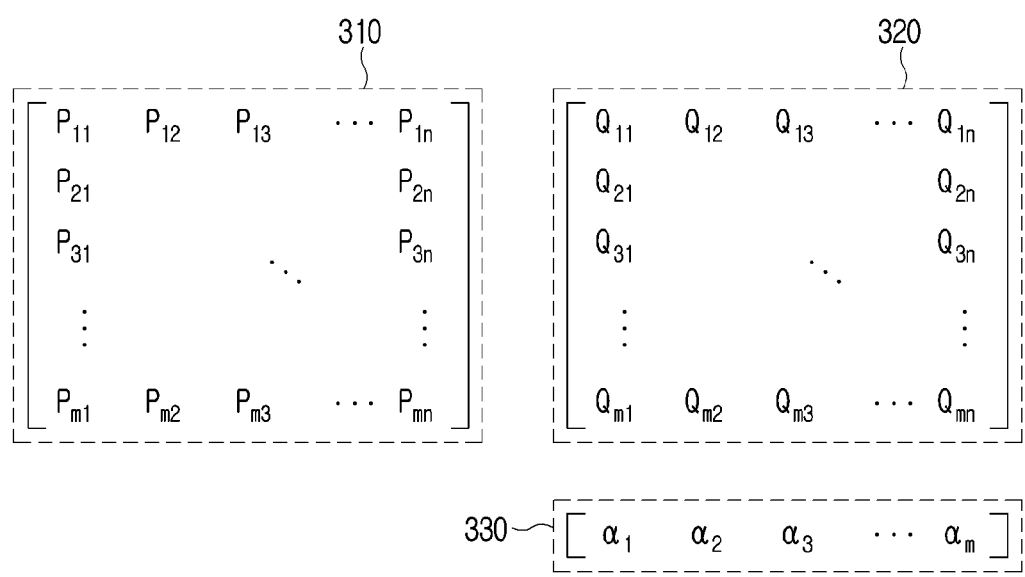
Figure 3C:
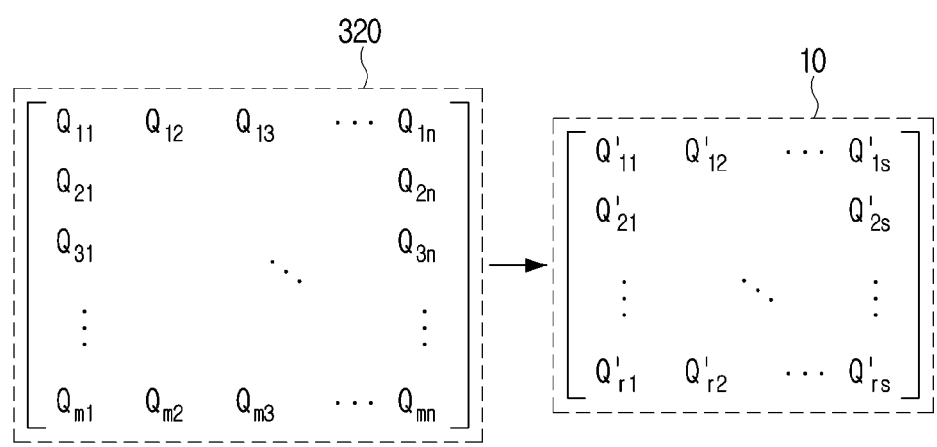

FIGS. 3A to 3C are views illustrating a compression method step-by-step according to an embodiment of the disclosure. The compression operation may be performed in a server. However, it is not limited thereto, and the electronic apparatus 100 may directly perform the compression operation. FIGS. 3A to 3C, it is described that the server performs a compression operation for convenience of description.

FIG. 3A is a view illustrating an example of an original matrix included in an artificial intelligence model. The original matrix is data before compression and may be in the form of n×m. For example, an original matrix may be in the form of 10000×8000. In addition, each of a plurality of elements in the original matrix may be 32 bits. In other words, the original matrix may include 10000×8000 32-bit elements. However, it is not limited thereto, and the size of the original matrix and the number of bits of each element may be different.

FIG. 3B is a view illustrating a result of pruning and quantizing the original matrix shown in FIG. 3A.

The server may prune each of the plurality of elements included in the original matrix based on a first threshold value, and obtain a pruning index matrix (Pruning Mask) 310 indicating whether each of the plurality of elements is pruned as binary data.

For example, the server may prune the original matrix by converting elements smaller than 30 among a plurality of elements included in the original matrix, to 0 and maintaining the remaining elements as they are. The server may obtain the pruning index matrix 310 by converting an element converted to 0 among the plurality of elements into 0 and the remaining elements into 1. In other words, the pruning index matrix 310 may have the same size as the original matrix, and may include 0 or 1.

In addition, the server may obtain a representative value matrix (Coefficient) 330 and a quantized matrix 320 by quantizing elements that are not pruned among the plurality of elements included in the original matrix.

The server may quantize n elements in each row of the original matrix of FIG. 3A using one representative value. For example, coefficient $\alpha\_1$ is a representative value of matrix elements $Q\_11$, $Q\_12$, $Q\_13$, . . . , $Q\_1n$, and coefficient $\alpha\_2$ is a representative value of matrix elements $Q\_21$, $Q\_22$, $Q\_23$, . . . , $Q\_2n$. Accordingly, FIG. 3B illustrates a representative value matrix 330 including m elements given that the original matrix has m rows. Here, the number n of elements quantized to a single representative value is only an example, and other values may be used, and if other values are used, the number of elements included in the representative value matrix 330 may also vary. In addition, the server may obtain the quantized matrix 320, and the quantized matrix 320 may have the same size as the original matrix and may include 0 or 1.

Figure 1D:
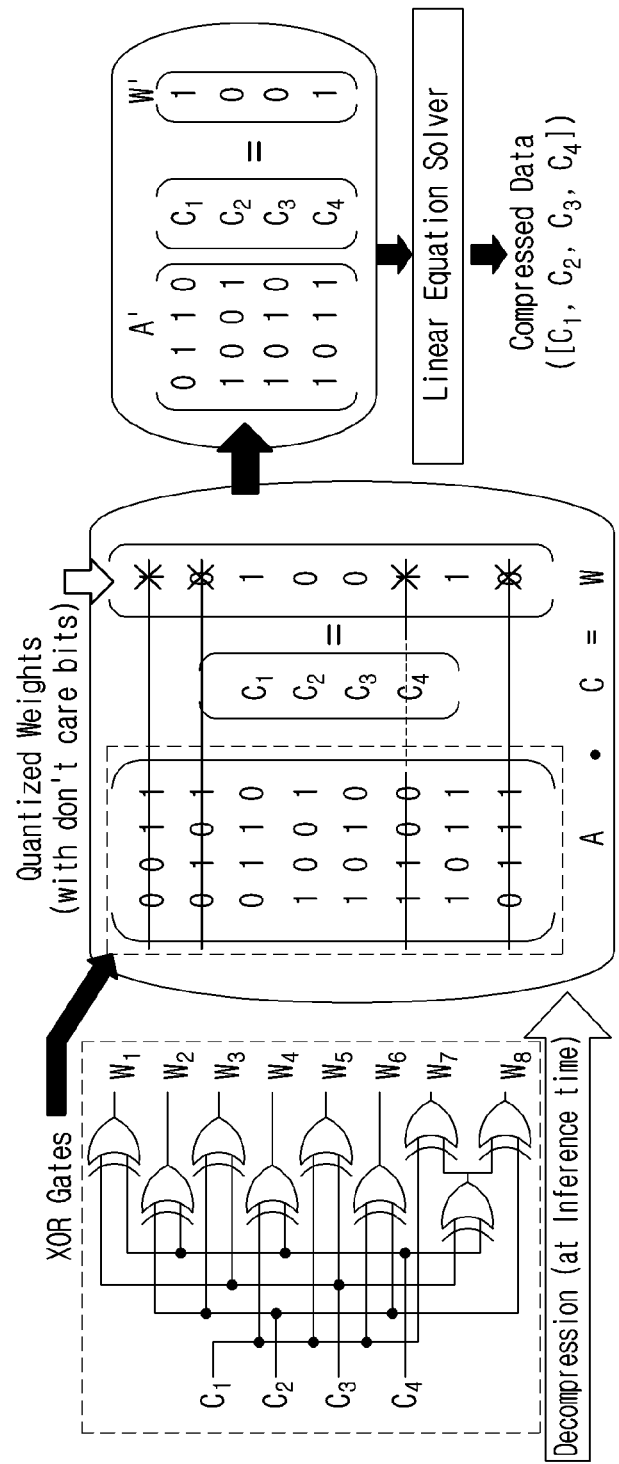
Figure 1E:
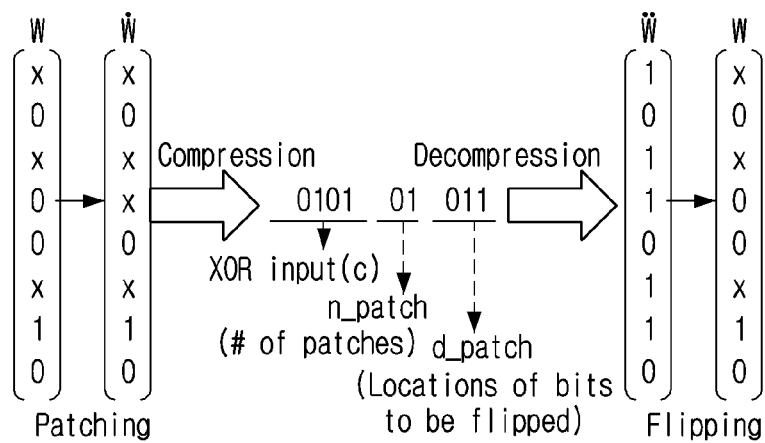
Figure 1F:
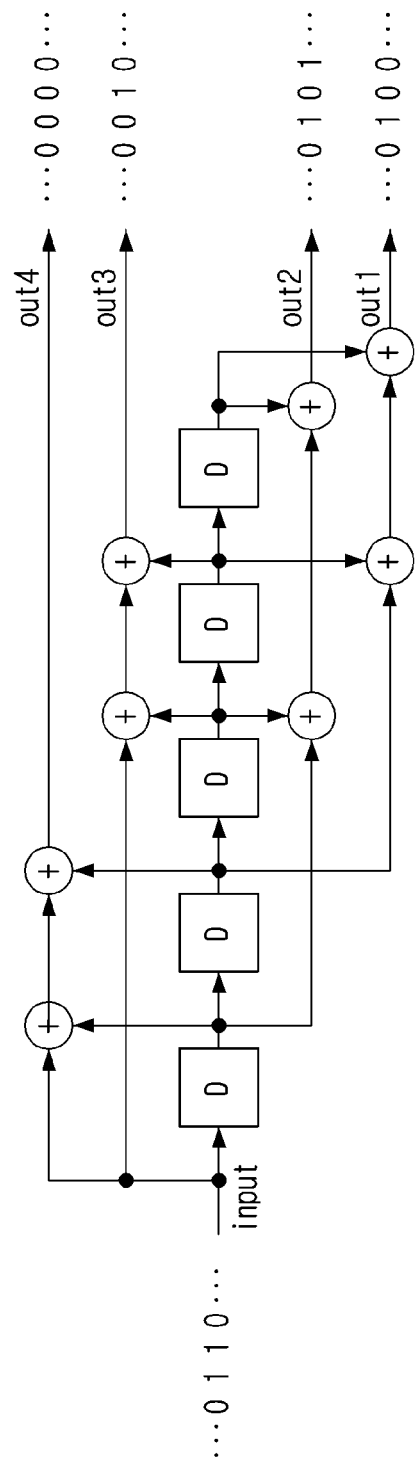

The server may compress the quantized matrix 320 into compressed data 10 as illustrated in FIG. 3C. The number of elements included in the compressed data 10 is less than the number of elements included in the quantized matrix 320. The compression method uses an encoding matrix similar to that shown in FIG. 1D, but there is a difference in a specific compression method, and a method of obtaining the compressed data 10 and differences will be described with reference to FIGS. 4A to 4C.

FIGS. 4A to 4C are views illustrating a method of obtaining compressed data 10 according to an embodiment of the disclosure.

FIG. 4A illustrates a method of compressing a predetermined number of elements B included in the quantized matrix to x using an encoding matrix A. X may be included in the compressed data. For example, 10 pieces of binary data included in the quantized matrix may be compressed into 8 pieces of binary data. In this case, the pruned data among 10 binary data is indicated as a symbol of "−", and does not need to be restored after compression. In other words, 10 equations may be generated according to a matrix multiplication of FIG. 4A, but equations including the pruned data "−" need not be considered.

The multiplication operation between binary data may be performed in the same manner as AND gate, an addition operation between the multiplication operation results may be performed in the same manner as XOR gate, and the AND gate has a higher priority than the XOR gate. In addition, the encoding matrix may include an element of a first type and an element of a second type, and the number of elements of the first type included in the encoding matrix and the number of elements of a second type included in the encoding matrix may be the same. For example, the encoding matrix may include 0 and 1, and the number of 0 and the number of 1 may be the same. However, it is not limited thereto, and when the number of elements included in the encoding matrix is an odd number, a difference between the number of 0 and the number of 1 may be within a predetermined number (e.g., 1).

When the above equation is solved, 10 pieces of binary data included in the quantized matrix may be compressed into 8 pieces of binary data. In other words, a matrix multiplication result of a binary data (x) and an encoding matrix (A) of the first number of units included in the compressed data may be the same as the corresponding binary data (B) of the second number of units included in the quantized matrix.

FIG. 4B illustrates a method of compressing 10 binary data following 10 binary data of FIG. 4A. In this case, in FIG. 4A, the compressed results may be output as X0 to X7, but in FIG. 4B, the compressed results may be output as X4 to X11. In other words, in the compression process of FIG. 4A and the compression process of FIG. 4B, X4 to X7 may be shared.

The above compression process may be equally applied in a subsequent process. For example, in the process of compressing 10 binary data next to 10 binary data of FIG. 4B, X8 to X11 of FIG. 4B may be shared.

In other words, 10 equations are generated in FIG. 4A, but the server obtains compressed data in consideration of all subsequent equations, such as 10 equations of FIG. 4B, in addition to the 10 equations of FIG. 4A. For example, the server may obtain compressed data in consideration of all equations through Gaussian elimination as illustrated in FIG. 4C. L of FIG. 4C is a value obtained by dividing the number of bits of a quantized weight by M, M is an output size of a decoder, N is an input size of a decoder, dp and dp_index are data for a dynamic algorithm, quantized_bits is a value cut to size M after converting a value of quantized weight into a one-dimensional vector, encoding_data is compressed bits, input array of decoder, patch_data are patch information used for inference together with encoding data, Sequence XOR Decoder(I1, I2) is an output of a Sequence XOR Decoder when I1 and I2 inputs are input, Number_patches(I1, I2, quantized_bits) is the number of patches when I1, I2 inputs are input, and Generate_patch_data(O1, O2) represents a command to generate patch data by comparing two inputs.

However, it is not limited thereto, and any other method may be used as long as it is a method for obtaining compressed data.

According to the example of FIGS. 4A to 4C, 10 binary data may be substantially converted into four pieces of binary data, and the converted binary data may form compressed data.

Even in this case, there may not be a solution that satisfies all equations. In this case, the server may obtain a solution that satisfies a maximum number of equations, and may generate patch information for equations that are not satisfied by the obtained solution.

The server may add a first flag indicating whether patch information is generated in the compression process of each group to the compressed data corresponding to each group. For example, if patch information has occurred in FIG. 4A, the server may generate X0 to X7 and a first flag indicating that patch information has occurred. For example, the server may generate a first flag having a value of 1 when patch information is generated, and may generate a first flag having a value of 0 when patch information is not generated.

The server may generate patch information separately from the compressed data, and the patch information may include a patch location for each group in which the patch information is generated and a second flag indicating whether an additional patch exists. For example, when one patch is required in FIG. 4A, the server may include a second flag (e.g., expressed as a value of 0) indicating a location of one patch and no additional patch. Alternatively, when two patches are required in FIG. 4A, the server may generate patch information for the first patch and patch information for a second patch. The patch information for the first patch includes a location of the first patch and a second flag (e.g., expressed as a value of 1) indicating that there is an additional patch, and the patch information for the second patch may include a location of the second patch and a second flag (e.g., expressed as a value of 0) indicating that there is no additional patch.

As described above, the server may perform compression in such a way that some compressed data is shared.

However, it is not limited thereto, and the number of binary data before compression and the number of binary data after compression may vary. Particularly, the server may perform compression such that patch information does not occur. In the example described above, if patch information is generated after compressing 10 binary data into 4 binary data, the server may compress 10 binary data into 5 binary data. The server may change the number of binary data after compression until patch information does not occur. In this case, a compression ratio may be lowered, but since patch information is not generated, data after compression may be reduced.

Figure 5:
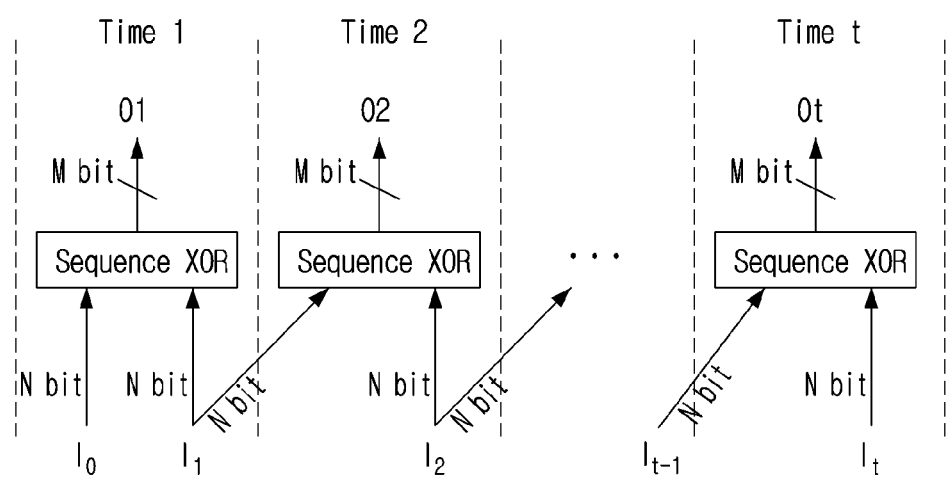
FIG. 5 is a view illustrating a method of decompressing compression according to an embodiment.

FIG. 5 is a view illustrating a method of decompressing compression according to an embodiment of the disclosure.

The decoder 120 may output M-bit O1 from compressed data of N-bit I0 and N-bit I1 in T1 (Time 1). For example, the decoder 120 may output 20-bit O1 from compressed data of 5-bit I0 and 5-bit I1 in T1.

The decoder 120 may output M-bit O2 from compressed data of N-bit I1 and N-bit I2 in T2. For example, the decoder 120 may output 20-bit O2 from compressed data of 5-bit I1 and 5-bit I2 in T2. In this case, the decoder 120 uses the compressed data of I1 of N bits used in T1 again.

By repeating these operations, the decoder 120 may output M bits of Ot from compressed data of N bits of It−1 and N bits of It in Tt. For example, the decoder 120 may output 20-bit Ot from compressed data of 5-bit It−1 and 5-bit It in Tt. Similarly, the decoder 120 uses the compressed data of It−1 of N bits used in Tt−1 again.

As a result, the decoder 120 outputs M bits using 2N bits. In other words, when viewed in units of each group, M bits are compressed to 2N bits, and a generation of patch information is reduced compared to the case where M bits are compressed to N bits. When looking at the entire data, a total of M×t bits from T1 to Tt are compressed into N×(t+1) bits, and a compression ratio is almost the same as that of compressing M bits into N bits.

Figure 6A:
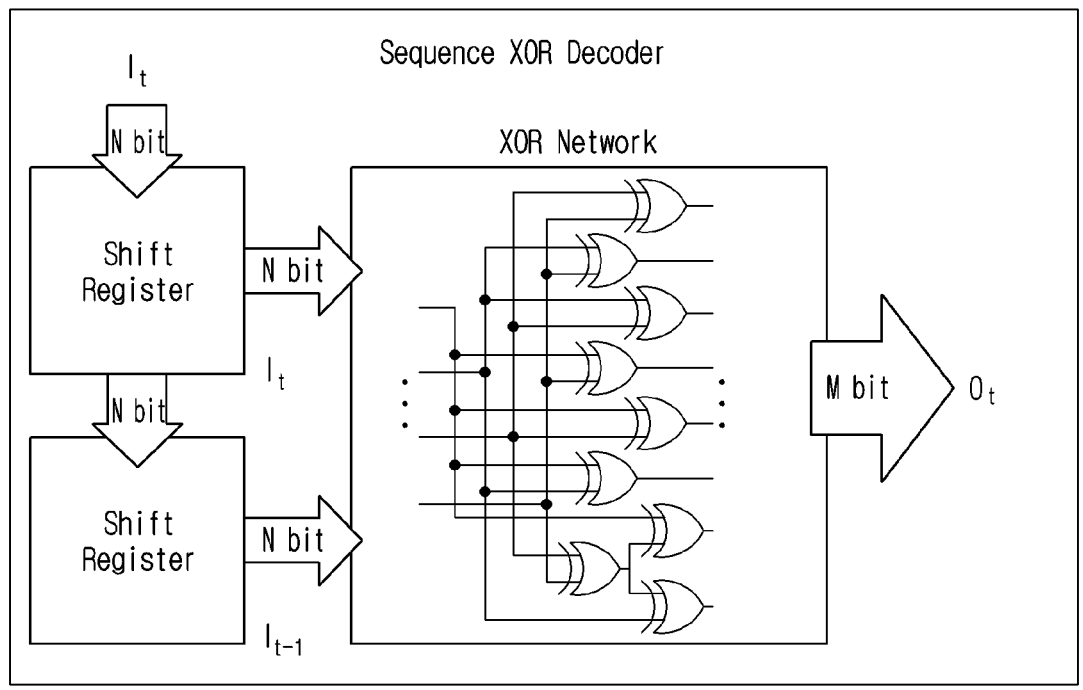
FIGS. 6A and 6B are views illustrating a method of implementing a decoder according to an embodiment.
Figure 6B:
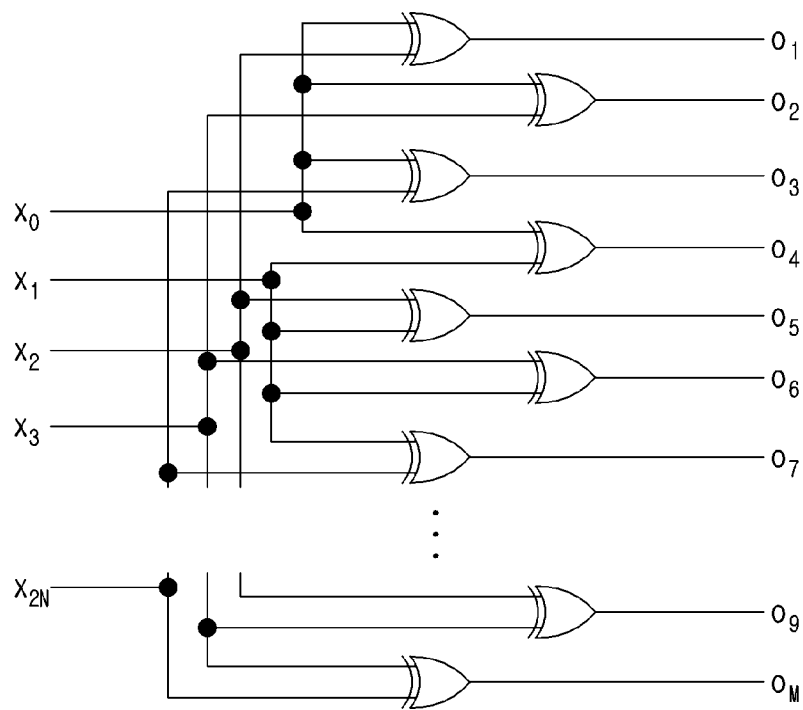

FIGS. 6A and 6B are views illustrating an implementation method of the decoder 120 according to an embodiment of the disclosure.

As described above, the decoder (e.g., a sequence XOR decoder) 120 may include a shift register that sequentially receives compressed data in group units including a predetermined number of bits and outputs data of at least two groups, and a plurality of logic circuits (e.g., an XOR network) for decompressing data output from the shift register and outputting the decompressed data.

The shift register may be implemented in a form in which two shift registers are separated, as illustrated in FIG. 6A. The upper first shift register may receive N-bit compressed data for each cycle, and when the cycle is changed, shift the stored compressed data to a lower second shift register.

The first shift register and the second shift register may provide input data to a plurality of logic circuits. In other words, the plurality of logic circuits may receive compressed data of 2N bits.

The plurality of logic circuits may be implemented with a plurality of XOR gates connected to each input/output terminal based on an encoding matrix, as illustrated in FIG. 6B. However, it is not limited thereto, and the decoder 120 may be implemented using a logic circuit other than the plurality of XOR gates, and any other method may be used as long as an operation corresponding to the encoding matrix can be performed.

Figure 7:
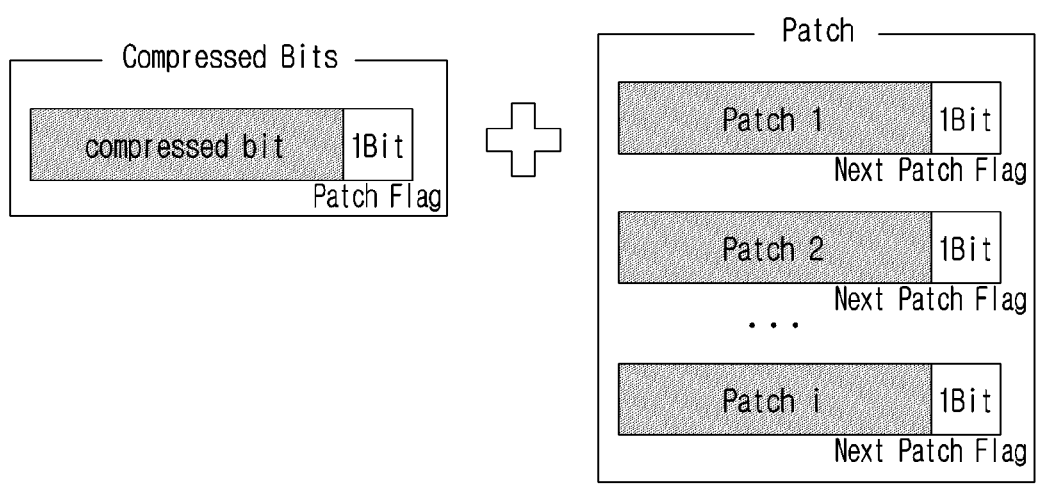
FIG. 7 is a view illustrating a first flag and a second flag according to an embodiment.

FIG. 7 is a view illustrating a first flag and a second flag according to an embodiment of the disclosure.

The server may add a first flag indicating whether patch information is generated in the compression process of each group to the compressed data corresponding to each group. For example, if patch information is generated in the compression process of the first group, the server may generate a first flag indicating that compressed data and patch information have occurred. For example, the server may generate a first flag having a value of 1 when patch information is generated, and may generate a first flag having a value of 0 when patch information is not generated.

In addition, when a patch is required, the server may generate patch information, and the patch information may include a patch location for each group in which the patch information is generated and a second flag indicating whether an additional patch exists. For example, when one patch is required, the server may include a second flag (e.g., expressed as a value of 0) indicating a location of one patch and no additional patch. Alternatively, when two patches are required, the server may generate patch information for a first patch and patch information for a second patch. The patch information for the first patch may include a location of the first patch (e.g., a location index corresponding to a data format of the decompressed data, such as a bit position in the compressed data when the compressed data is a n-bit binary number, or a column number and a row number when the decompressed data has a matrix form) and a second flag (e.g., expressed as a value of 1) indicating that there is an additional patch, and the patch information for the second patch may include a location of the second patch a second flag (e.g., expressed as a value of 0) indicating that there is no additional patch.

The processor 130 may change binary data values of some of a plurality of elements included in a decompressed data based on the patch information. For example, if the first flag is 0, the processor 130 may not perform any operation. Alternatively, if the first flag is 1, the processor 130 may change a binary data value of one of the plurality of elements included in the decompressed data based on the patch information. Also, if the second flag included in the patch information is 0, the processor 130 may not perform an additional operation after changing one binary data value. Alternatively, if the second flag included in the patch information is 1, the processor 130 may change a binary data value of one of the plurality of elements included in the decompressed data based on the next patch information. The processor 130 may repeat the same operation until the second flag included in the patch information becomes 0.

As described above, the compressed data and the patch information are stored separately, and particularly, since the patch information does not have a separate index, a data capacity due to index may be reduced.

Figure 8A:
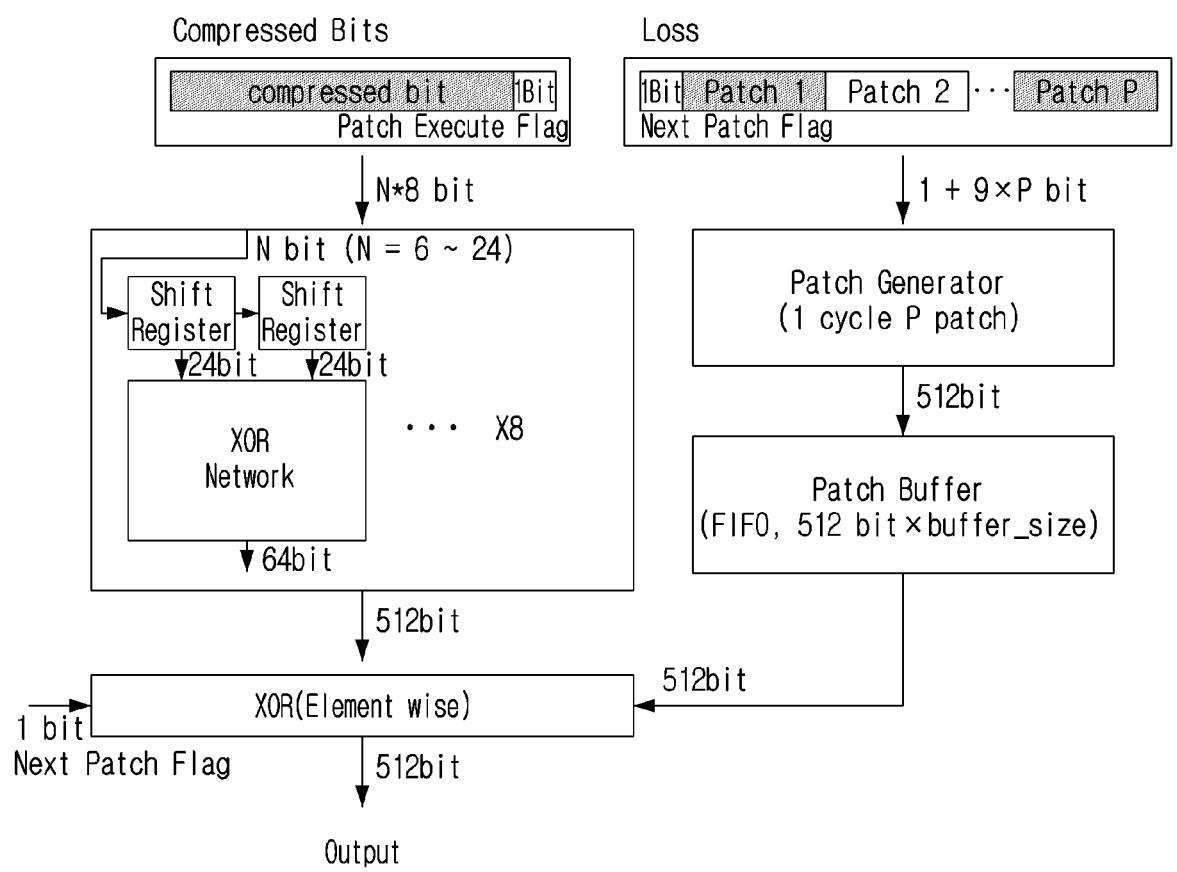

FIGS. 8A and 8B are views illustrating an implementation method of the electronic apparatus 100 according to an embodiment of the disclosure.

Since the operation of the decoder 120 including the left shift register and the plurality of logic circuits is the same as that described with reference to FIGS. 6A and 6B, an overlapping description will be omitted.

In FIG. 8A, it is assumed that the decoder 120 outputs 512-bit data, the data output from the decoder 120 may include a loss occurring during a compression process, and it is necessary to change binary data value based on the patch information.

For this operation, the processor 130 may be implemented as a patch generator, a patch buffer, and an element wise (XOR). The patch generator may make a value of a location to change the binary data value to 1 and the remaining of the value to 0 based on the patch information. In this case, when the number of patches for the input exceeds P, the operation described above may be repeated a plurality of times, and when this operation is completed, 512-bit data may be generated.

The patch buffer may store 512-bit data generated by the patch generator and may perform a first in first output (FIFO) operation to output the 512-bit data in the order they are input.

An element wise logical operator (e.g., a logical operator XOR) may obtain a final output by performing an element wise XOR operation based on the output of the decoder 120 and the output of the patch buffer. In other words, the element wise logical operator may change some binary data among outputs of the decoder 120 as illustrated in FIG. 8B.

When there is no data in a patch buffer, the decoder 120 rests until data is accumulated in the patch buffer, which may result in a time loss. This problem may be solved by increasing a performance of the patch generator and patch buffer, and it is a problem of requiring a trade-off between hardware cost and execution time.

The above hardware may be adjusted according to various situations, and when P is 3 and a buffer size is 4, it has a memory reduction rate of 5% for 91% pruning and 61% for 70% pruning. In this case, a rate reduction is less than 10%. As a result, a circuit area and power consumption are small with a simple hardware design, and a power consumption required for storage may also be reduced by storing more compressed data than in the prior art. In addition, since data can be decompressed in real time while reading data, it may be applied to various accelerators.

Figure 9:
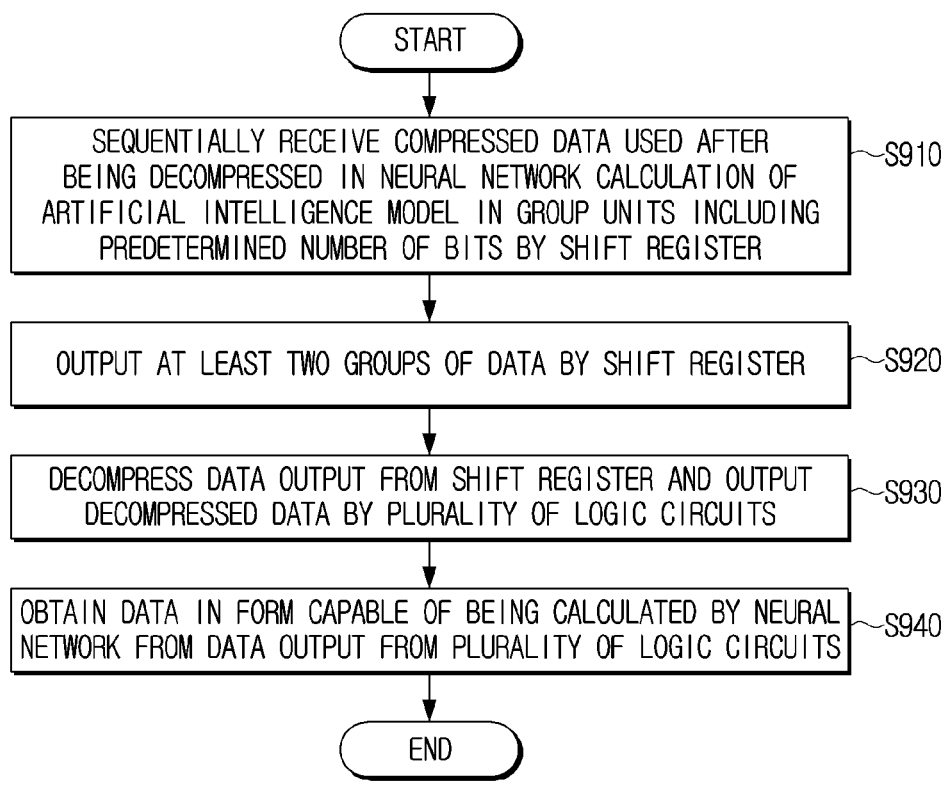
FIG. 9 is a flowchart illustrating a method of controlling an electronic apparatus according to an embodiment.

FIG. 9 is a flowchart illustrating a method of controlling an electronic apparatus according to an embodiment of the disclosure.

The shift register may sequentially receive the compressed data to be used after being decompressed in the neural network calculation of the artificial intelligence model, in group units including a predetermined number of bits (operation S910). The shift register may output at least two groups of data (operation S920). Then, the plurality of logic circuits may decompress the data output from the shift register and output the decompressed data (operation S930). Data in a form capable of being calculated by a neural network may be obtained from data output from the plurality of logic circuits (operation S940). The decompressed data may include a plurality of parameters within the neutral network, such as weights (and biases) that are assigned to a plurality of nodes (or neurons) of the neural network, respectively. When an input value enters a node of the neural network, the neural network multiplies the input value by a weight that is assigned to the node (and adds a bias assigned to the node, if any), to obtain a result value. As such, the neutral network may be constructed or configured using a plurality of weights in the decompressed data.

Operation 940 of receiving S910 may include receiving data of a first group among compressed data in a first cycle, shift data of the first group in a second cycle, receive data of a second group among compressed data, and operation S920 of outputting at least two groups of data may include outputting the first group of data and the second group of data.

Operation S910 of receiving may include deleting the data of the first group input in a n−2th cycle in a nth cycle (n is a natural number greater than 2), shift the data of the second group input in a n−1th cycle, and receive the data of the third group among the compressed data, and operation S920 of outputting the data of at least two groups may include outputting the data of the second group and the data of the third group.

In operation S930 of outputting the decompressed data, a plurality of XOR gates may decompress data output from the shift register and output the decompressed data. Operation 930 may also include configuring a neural network based on the decompressed data, for example, by assigning a plurality of weight values included in the decompressed data to a plurality of nodes of the neural network, respectively.

In addition, operation S940 may include updating the decompressed data by changing binary data values of some of the plurality of elements included in the decompressed data based on the patch information corresponding to the compressed data, and the patch information may include error information generated in the process of obtaining data.

Each of the plurality of groups of compressed data may include a first flag indicating whether a patch is present, and the patch information may include a second flag indicating a patch location for each of at least one group among the plurality of groups and a second flag indicating whether an additional patch exists.

Operation S940 may include obtaining data in a form that can be calculated by a neural network based on a representative value matrix corresponding to the updated data and the compressed data, and the control method may further include performing neural network calculation using the data in a form that can be calculated by the neural network, and the updated data and representative value matrix may be matrices obtained by quantizing the original matrix included in the artificial intelligence model.

Operation S940 may include updating the data in a form that can be calculated by the neural network based on the pruning index matrix corresponding to the compressed data, and the pruning index matrix is a matrix obtained in the pruning process of the original matrix, and may be used in the process of obtaining compressed data. The weights of the nodes of the neural network may be updated according to the update on the decompressed data.

The method may further include performing a neural network calculation on data in a form capable of neural network calculation by using a plurality of processing elements arranged in a matrix form.

In addition, the electronic apparatus may be implemented as a single chip.

According to various embodiments of the disclosure as described above, the electronic apparatus may decompress the data by using shared data a plurality of times in the compression process using the shift register, and accordingly, and reduce a size of the patch information by reducing errors while securing a high compression ratio.

In addition, parallel processing of data may be possible, real-time decompression through hardware is possible and may be applied to all accelerators.

According to an embodiment, the various embodiments described above may be implemented as software including instructions stored in a machine-readable storage media which is readable by a machine (e.g., a computer). The device may include the electronic device according to the disclosed embodiments, as a device which calls the stored instructions from the storage media and which is operable according to the called instructions. When the instructions are executed by a processor, the processor may directory perform functions corresponding to the instructions using other components or the functions may be performed under a control of the processor. The instructions may include code generated or executed by a compiler or an interpreter. The machine-readable storage media may be provided in a form of a non-transitory storage media. The 'non-transitory' means that the storage media does not include a signal and is tangible, but does not distinguish whether data is stored semi-permanently or temporarily in the storage media.

In addition, according to an embodiment, the methods according to various embodiments described above may be provided as a part of a computer program product. The computer program product may be traded between a seller and a buyer. The computer program product may be distributed in a form of the machine-readable storage media (e.g., compact disc read only memory (CD-ROM) or distributed online through an application store (e.g., PlayStore™). In a case of the online distribution, at least a portion of the computer program product may be at least temporarily stored or provisionally generated on the storage media such as a manufacturer's server, the application store's server, or a memory in a relay server.

Various exemplary embodiments described above may be embodied in a recording medium that may be read by a computer or a similar apparatus to the computer by using software, hardware, or a combination thereof. In some cases, the embodiments described herein may be implemented by the processor itself. In a software configuration, various embodiments described in the specification such as a procedure and a function may be embodied as separate software modules. The software modules may respectively perform one or more functions and operations described in the present specification.

According to various embodiments described above, computer instructions for performing processing operations of a device according to the various embodiments described above may be stored in a non-transitory computer-readable medium. The computer instructions stored in the non-transitory computer-readable medium may cause a particular device to perform processing operations on the device according to the various embodiments described above when executed by the processor of the particular device. The non-transitory computer readable recording medium refers to a medium that stores data and that can be read by devices. For example, the non-transitory computer-readable medium may be CD, DVD, a hard disc, Blu-ray disc, USB, a memory card, ROM, or the like.

Further, each of the components (e.g., modules or programs) according to the various embodiments described above may be composed of a single entity or a plurality of entities, and some subcomponents of the above-mentioned subcomponents may be omitted or the other subcomponents may be further included to the various embodiments. Generally, or additionally, some components (e.g., modules or programs) may be integrated into a single entity to perform the same or similar functions performed by each respective component prior to integration. Operations performed by a module, a program module, or other component, according to various exemplary embodiments, may be sequential, parallel, or both, executed iteratively or heuristically, or at least some operations may be performed in a different order, omitted, or other operations may be added.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An electronic apparatus comprising:
   a memory configured to store compressed data that is to be decompressed for a neural network calculation of an artificial intelligence model;
   a decoder comprising
   a shift register configured to sequentially receive the compressed data in group units and output at least two groups of the compressed data, and
   a plurality of logic circuits configured to decompress the at least two groups of the compressed data to obtain decompressed data; and
   a processor configured to obtain the decompressed data in a form capable of being calculated by a neural network.

2. The electronic apparatus of claim 1, wherein the at least two groups comprise a first group and a second group, and
   wherein the shift register is further configured to:
   receive first data of the first group among the compressed data in a first cycle,
   shift the first data of the first group and receive second data of the second group among the compressed data in a second cycle, and
   output the first data and the second data.

3. The electronic apparatus of claim 1, wherein the at least two groups comprise a first group, a second group, and a third group,
   wherein the shift register is further configured to:
   delete, in a nth cycle, first data of the first group input in a n−2th cycle;
   shift second data of the second group input in a n−1th cycle;
   receive third data of the third group among the compressed data, and
   output the second data and the third data, and
   wherein n is a natural number that is greater than 2.

4. The electronic apparatus of claim 1, wherein the plurality of logic circuits are configured to decompress the at least two groups of the compressed data output from the shift register through a plurality of XOR gates related to a compression method of the compressed data, and output the decompressed data.

5. The electronic apparatus of claim 1, wherein the memory is configured to further store patch information corresponding to the compressed data,
   wherein the processor is further configured to update the decompressed data by changing a binary data value of at least one of a plurality of elements included in the decompressed data based on the patch information, and
   wherein the patch information includes error information generated in a process of obtaining the compressed data.

6. The electronic apparatus of claim 5, wherein each of the at least two groups of the compressed data includes a first flag indicating whether a patch exists, and
   wherein the patch information includes a second flag indicating a patch location with respect to each of the at least two groups, and whether an additional patch exists.

7. The electronic apparatus of claim 5, wherein the memory is further configured to store a representative value matrix corresponding to each of the at least two groups of the compressed data,
   wherein the processor is further configured to:
   obtain data in a form capable of being calculated by the neural network based on the updated decompressed data and the representative value matrix, and
   perform the neural network calculation using the data in the form capable of being calculated by the neural network, and
   wherein the updated decompressed data and the representative value matrix are matrices acquired by quantizing an original matrix included in the artificial intelligence model.

8. The electronic apparatus of claim 7, wherein the processor is further configured to acquire a pruning index matrix from the original matrix through a pruning process, to be used in a process of acquiring the compressed data, and update the decompressed data in the form capable of being calculated by the neural network based on the pruning index matrix.

9. The electronic apparatus of claim 1, wherein the processor includes a plurality of processing elements arranged in a matrix form, and
   wherein the processor is further configured to perform the neural network calculation with respect to the data in the form capable of being calculated by the neural network using the plurality of processing elements.

10. The electronic apparatus of claim 1, wherein the electronic apparatus is configured to be implemented as a single chip.

11. A method for controlling an electronic apparatus, the method comprising:
    sequentially receiving a compressed data, that is to be decompressed for a neural network calculation of an artificial intelligence model;
    outputting at least two groups of the compressed data that are shifted by a shift register;
    decompressing the at least two groups of the compressed data by a plurality of logic circuits to obtain decompressed data; and
    obtaining data in a form capable of being calculated by a neural network from the decompressed data.

12. The method of claim 11, wherein the at least two groups comprise a first group and a second group,
    wherein the sequentially receiving comprises receiving first data of the first group among the compressed data in a first cycle, shifting the first data of the first group, and receiving second data of the second group among the compressed data in a second cycle, and
    wherein the outputting the at least two groups of the compressed data comprises outputting the first data and the second data.

13. The method of claim 11, wherein the at least two groups comprise a first group, a second group, and a third group, wherein the sequentially receiving comprises deleting, in a nth cycle, first data of the first group input in a n−2th cycle, shifting second data of the second group input in a n−1th cycle, and receiving third data of the third group among the compressed data, wherein the outputting the at least two groups of the compressed data comprises outputting the second data and the third data, and wherein n is a natural number greater than 2.

14. The method of claim 11, wherein the decompressing the at least two groups of the compressed data comprises decompressing the at least two groups of the compressed data through a plurality of XOR gates.

15. The method of claim 11, wherein the obtaining the data comprises, based on patch information corresponding to the compressed data, updating the decompressed data by changing a binary data value of at least one of a plurality of elements included in the decompressed data, and wherein the patch information includes error information generated in a process of obtaining the compressed data.

16. An electronic apparatus comprising:

a memory storing one or more instructions; and a processor configured to:

shift compressed data sequentially in first cycle and a second cycle, to obtain a first group of shifted compressed data and a second group of shifted compressed data, respectively, decompress the first group of shifted compressed data and the second group of shifted compressed data via at least one logic gate, to obtain decompressed data;

configure a neural network based on a plurality of weights contained the decompressed data; and process input data using the neural network configured based on the plurality of weights.

17. The electronic apparatus of claim 16, wherein the processor is further configured to:

retrieve from the memory, patch information that comprises error information generated in a compression processing of obtaining the compressed data;

update the decompressed data by changing at least one binary value of the decompressed data based on the patch information; and configure the neural network based on the updated decompressed data.

18. The electronic apparatus of claim 16, wherein the processor is further configured to:

obtain a first flag indicating whether a patch exists;

obtain a second flag indicating a patch location of the patch with respect to at least one of the first group of shifted compressed data and the second group of shifted compressed data;

obtain at least one representative value matrix corresponding to the at least one of the first group of shifted compressed data and the second group of shifted compressed data; and update the decompressed data by changing at least one binary value of the decompressed data, based on the first flag, the second flag, and the at least one representative value matrix.

* * * * *